US012275040B2

(12) United States Patent
Umezawa et al.

(10) Patent No.: US 12,275,040 B2
(45) Date of Patent: Apr. 15, 2025

(54) PIEZOELECTRIC DEVICE AND ULTRASONIC TRANSDUCER

(71) Applicant: Murata Manufacturing Co., Ltd., Nagaokakyo (JP)

(72) Inventors: Seiji Umezawa, Nagaokakyo (JP); Shinsuke Ikeuchi, Nagaokakyo (JP); Fumiya Kurokawa, Nagaokakyo (JP); Nobuyoshi Adachi, Nagaokakyo (JP); Masayuki Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 846 days.

(21) Appl. No.: 17/507,845

(22) Filed: Oct. 22, 2021

(65) Prior Publication Data
US 2022/0040736 A1     Feb. 10, 2022

Related U.S. Application Data

(63) Continuation of application No. PCT/JP2020/015815, filed on Apr. 8, 2020.

(30) Foreign Application Priority Data

May 16, 2019  (JP) .................................. 2019-092681
Jul. 9, 2019   (JP) .................................. 2019-127482

(51) Int. Cl.
    *B06B 1/06*     (2006.01)
(52) U.S. Cl.
    CPC ............................. *B06B 1/0666* (2013.01)

(58) Field of Classification Search
    CPC . H04R 1/02; H04R 17/00; H03H 9/02; H03H 9/17; H10N 30/20; H10N 30/30; B06B 1/0666; B06B 1/0692
    See application file for complete search history.

(56) References Cited

U.S. PATENT DOCUMENTS

2007/0047744 A1   3/2007  Harney et al.
2007/0058826 A1   3/2007  Sawamoto et al.
(Continued)

FOREIGN PATENT DOCUMENTS

JP   2007-081614 A    3/2007
JP   2008-283312 A   11/2008
(Continued)

OTHER PUBLICATIONS

First Office Action in JP2021-519305, mailed Oct. 4, 2022, 3 pages.
(Continued)

*Primary Examiner* — J. San Martin
(74) *Attorney, Agent, or Firm* — Keating & Bennett, LLP

(57) ABSTRACT

A piezoelectric device includes a substrate, a piezoelectric element, and a lid. The piezoelectric element includes a base portion and a membrane portion. The base portion is on a first main surface and has an annular outer shape when viewed from a normal direction of the first main surface. The membrane portion is at an inner side portion of the base portion when viewed from the normal direction. The lid is on the first main surface, covers the piezoelectric element, and is spaced apart from the piezoelectric element on the first main surface side. In the substrate, a first through hole extending from the first main surface to a second main surface is facing the membrane portion. The membrane portion includes a through slit.

19 Claims, 15 Drawing Sheets

(56) References Cited

U.S. PATENT DOCUMENTS

| | | | |
|---|---|---|---|
| 2010/0202649 A1 | 8/2010 | Inoda et al. | |
| 2012/0300969 A1 | 11/2012 | Tanaka et al. | |
| 2013/0069180 A1 | 3/2013 | Umeda et al. | |
| 2016/0150324 A1* | 5/2016 | Yoo | H04R 31/00 |
| | | | 381/356 |
| 2017/0069820 A1 | 3/2017 | Hada et al. | |
| 2017/0184718 A1 | 6/2017 | Horsley et al. | |
| 2018/0007474 A1* | 1/2018 | Cargill | B81B 3/0072 |
| 2018/0220240 A1* | 8/2018 | Yoo | B81B 3/007 |
| 2019/0110131 A1 | 4/2019 | Kitamura et al. | |
| 2022/0401994 A1* | 12/2022 | Kurokawa | G10K 11/02 |
| 2022/0408185 A1* | 12/2022 | Barsukou | H04R 17/02 |
| 2023/0337544 A1* | 10/2023 | Grosh | H04R 17/00 |
| 2024/0284121 A1* | 8/2024 | Ikeuchi | B06B 1/0666 |

FOREIGN PATENT DOCUMENTS

| | | | |
|---|---|---|---|
| JP | 2009-506658 A | 2/2009 | |
| JP | 2010-187076 A | 8/2010 | |
| JP | 2018098546 A | 6/2018 | |
| WO | 2011/093157 A1 | 8/2011 | |
| WO | 2011/152212 A1 | 12/2011 | |
| WO | 2015/190429 A1 | 12/2015 | |
| WO | 2017/221762 A1 | 12/2017 | |

OTHER PUBLICATIONS

Official Communication issued in International Patent Application No. PCT/JP2020/015815, mailed on Jun. 30, 2020.

\* cited by examiner

PIEZOELECTRIC DEVICE AND ULTRASONIC TRANSDUCER

CROSS REFERENCE TO RELATED APPLICATIONS

This application claims the benefit of priority to Japanese Patent Application No. 2019-127482 filed on Jul. 9, 2019 and Japanese Patent Application No. 2019-092681 filed on May 16, 2019, and is a Continuation Application of PCT Application No. PCT/JP2020/015815 filed on Apr. 8, 2020. The entire contents of each application are hereby incorporated herein by reference.

BACKGROUND OF THE INVENTION

1. Field of the Invention

The present invention relates to piezoelectric devices and ultrasonic transducers.

2. Description of the Related Art

U.S. Patent Application Publication No. 2017/0184718 discloses a configuration of a piezoelectric device. The piezoelectric device described in U.S. Patent Application Publication No. 2017/0184718 includes a substrate, a lid attached to the substrate, an ultrasonic transducer that includes a membrane capable of being driven and that is mounted on the substrate, and an integrated circuit that is mounted on the substrate and coupled to the ultrasonic transducer so as to be able to act on the ultrasonic transducer. The lid surrounds the ultrasonic transducer and the integrated circuit. An acoustic cavity is formed in the substrate. The ultrasonic transducer is fixed to the substrate so as to substantially cover the acoustic cavity.

U.S. Patent Application Publication No. 2017/0184718 exemplifies a case in which a piezoelectric device operates with ultrasonic waves at 200 kHz, which is a relatively high frequency. Ultrasonic waves are amplified by resonating in a through hole.

However, in the above-described piezoelectric device, when it is attempted to transmit and receive ultrasonic waves of a relatively low frequency such as 40 kHz, the mechanical vibration frequency of the membrane portion is also lowered. In particular, when the mechanical vibration frequency of the membrane portion is low, the drive of the membrane is inhibited by residual stress in the membrane. This makes it difficult for the piezoelectric device described above to efficiently transmit and receive low-frequency ultrasonic waves.

SUMMARY OF THE INVENTION

Preferred embodiments of the present invention provide piezoelectric devices that are each able to efficiently transmit and receive low-frequency ultrasonic waves.

A piezoelectric device according to a preferred embodiment of the present invention includes a substrate, a piezoelectric element, and a lid. The substrate includes a first main surface and a second main surface opposite to the first main surface. The piezoelectric element is on the first main surface. The piezoelectric element includes a base portion and a membrane portion. The base portion is on the first main surface and has an annular outer shape when viewed from a normal direction of the first main surface. The membrane portion is at an inner side portion of the base portion when viewed from the normal direction. The lid is on the first main surface and covers the piezoelectric element while being spaced apart from the piezoelectric element on the first main surface side. In the substrate, a first through hole extending from the first main surface to the second main surface is provided at a position facing the membrane portion. A through slit is provided in the membrane portion.

An ultrasonic transducer according to a preferred embodiment of the present invention includes a mounting substrate and a piezoelectric device mounted on the mounting substrate. The piezoelectric device includes a substrate, a piezoelectric element, and a lid. The substrate includes a first main surface and a second main surface opposite to the first main surface. The piezoelectric element is on the first main surface. The piezoelectric element includes a base portion and a membrane portion. The base portion is on the first main surface and has an annular outer shape when viewed from a normal direction of the first main surface. The membrane portion is at an inner side portion of the base portion when viewed from the normal direction. The lid is on the first main surface and covers the piezoelectric element while being spaced apart from the piezoelectric element on the first main surface side. In the substrate, a first through hole extending from the first main surface to the second main surface faces the membrane portion. The membrane portion includes a through slit. The mounting substrate faces the second main surface. The mounting substrate includes a third through hole. An end portion on the piezoelectric device side of the third through hole faces the first through hole.

According to preferred embodiments of the present invention, low-frequency ultrasonic waves are able to be efficiently transmitted and received.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
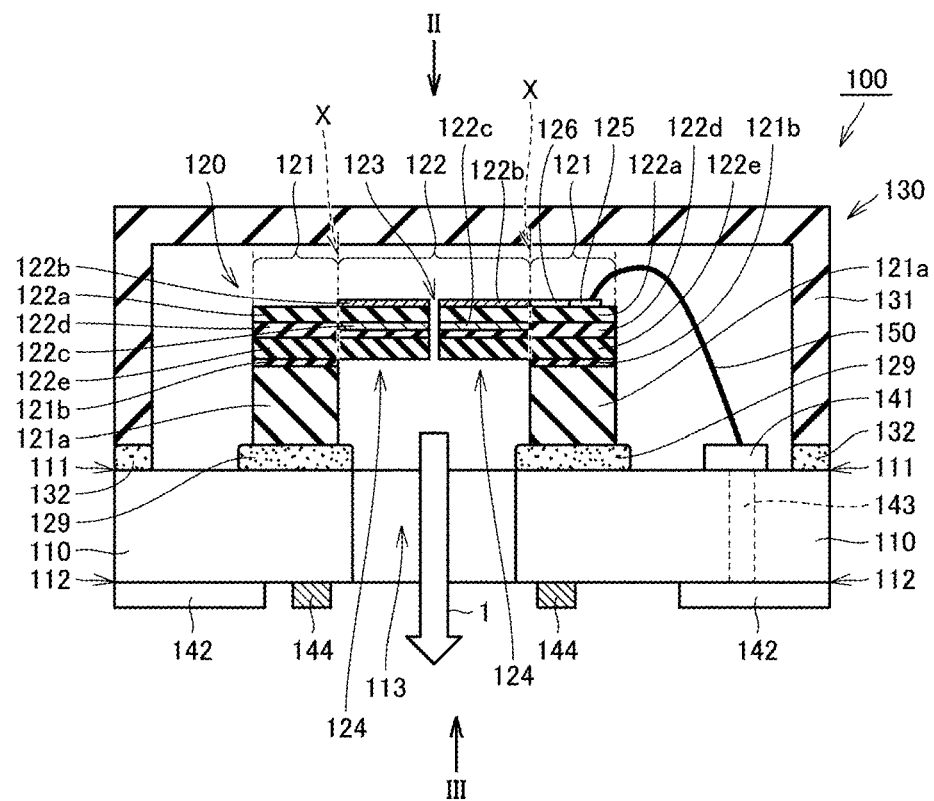
FIG. 1 is a sectional view illustrating a piezoelectric device according to Preferred Embodiment 1 of the present invention.

Hereinafter, piezoelectric devices and ultrasonic transducers according to preferred embodiments of the present invention will be described with reference to the drawings. In the following description of the preferred embodiments, the same or corresponding portions in the drawings are denoted by the same reference symbols, and the description thereof will not be repeated.

Preferred Embodiment 1

Figure 2:
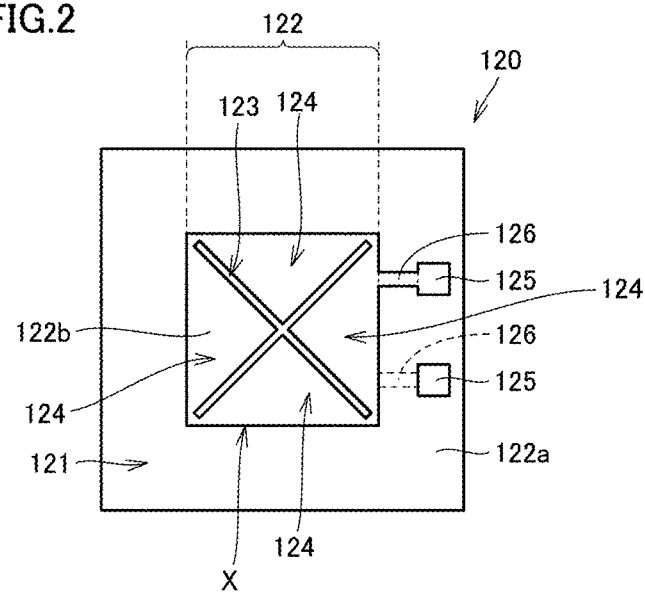
FIG. 2 is a view illustrating only a piezoelectric element when the piezoelectric device illustrated in FIG. 1 is seen from an arrow II direction.
Figure 3:
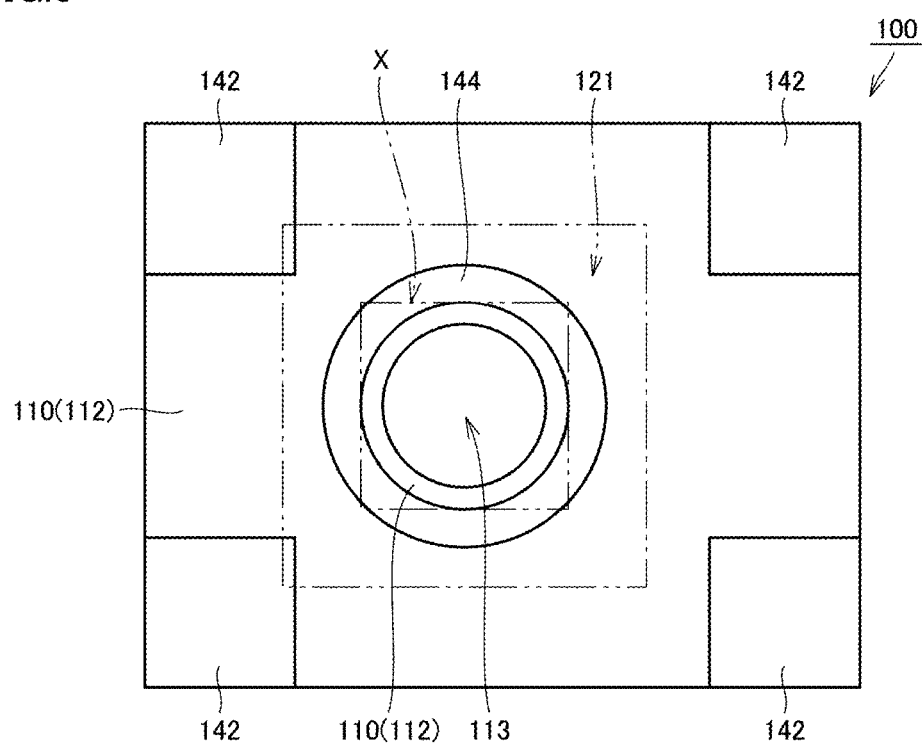
FIG. 3 is a bottom view when the piezoelectric device illustrated in FIG. 1 is seen from an arrow III direction.

A piezoelectric device according to Preferred Embodiment 1 of the present invention will be described. FIG. 1 is a sectional view illustrating a piezoelectric device according to Preferred Embodiment 1 of the present invention. FIG. 2 is a view illustrating only a piezoelectric element when the piezoelectric device illustrated in FIG. 1 is seen from an arrow II direction. FIG. 3 is a bottom view when the piezoelectric device illustrated in FIG. 1 is seen from an arrow III direction.

As illustrated in FIG. 1, a piezoelectric device 100 according to Preferred Embodiment 1 of the present invention includes a substrate 110, a piezoelectric element 120, and a lid 130.

The substrate 110 includes a first main surface 111 and a second main surface 112 opposite to the first main surface 111. A first through hole 113 is provided in the substrate 110. Details of the first through hole 113 will be described later.

As illustrated in FIGS. 1 and 3, in the present preferred embodiment, the substrate 110 has a rectangular or substantially rectangular outer shape when viewed from the normal direction of the first main surface 111. When viewed from the normal direction, a length of one side of the substrate 110 is in a range from about 1 mm to about 3 mm, for example. The thickness in the normal direction of the substrate 110 is, for example, in a range from about 0.1 mm to about 0.3 mm.

Examples of the substrate 110 include a substrate including a material in which resin and glass fibers are combined such as a glass epoxy substrate, a low temperature co-fired ceramics (LTCC) multilayer substrate, and a substrate including a ceramic material made of alumina or the like.

As illustrated in FIG. 1, a plurality of first electrodes 141 are spaced apart from each other on the first main surface 111. In FIG. 1, only one first electrode 141 is shown among the plurality of first electrodes 141. Each of the plurality of first electrodes 141 is electrically connected to an electrode included in the piezoelectric element 120 to be described later.

A plurality of second electrodes 142 are spaced apart from each other on the second main surface 112. When the piezoelectric device 100 is mounted on a mounting substrate, each of the plurality of second electrodes 142 is electrically connected to the mounting substrate.

In the present preferred embodiment, each of the plurality of first electrodes 141 and any second electrode 142 among the plurality of second electrodes 142 are electrically connected to each other by a via electrode 143. The via electrode 143 extends through the substrate 110 so as to extend from the first main surface 111 to the second main surface 112.

As illustrated in FIGS. 1 and 2, the piezoelectric element 120 is located on the first main surface 111. The piezoelectric element 120 includes a base portion 121 and a membrane portion 122.

The base portion 121 is located on the first main surface 111 and has an annular outer shape when viewed from a normal direction of the first main surface 111. In the present preferred embodiment, a circumferential side surface of the base portion 121 has a rectangular or substantially rectangular shape when viewed from the normal direction. When viewed from the normal direction, the circumferential side surface of the base portion 121 may have a circular or substantially circular shape or a polygonal or substantially polygonal shape, for example.

The membrane portion 122 is located at an inner side portion of the base portion 121 when viewed from the normal direction. The membrane portion 122 is supported by the base portion 121. Accordingly, in the piezoelectric element 120, a recess surrounded by the base portion 121 and the membrane portion 122 is provided on the substrate 110 side.

In the present preferred embodiment, the membrane portion 122 has a rectangular or substantially rectangular outer shape, specifically, a square or substantially square outer shape when viewed from the normal direction. The length of one side of the membrane portion 122 as viewed from the normal direction is, for example, in a range from about 0.5 mm to about 1.5 mm. The membrane portion 122 may have, for example, a circular or other polygonal outer shape when viewed from the normal direction. The thickness in the normal direction of the membrane portion 122 is, for example, in a range from about 0.5 μm to about 6.0 μm.

In the membrane portion 122, a through slit 123 extends through from the substrate 110 side to the opposite side to the substrate 110 side. In the present preferred embodiment, since the through slit 123 is provided, the membrane portion 122 includes a plurality of beams 124. In the present preferred embodiment, one end of each of the plurality of beams 124 is supported by the base portion 121. Both ends of each of the plurality of beams 124 may be supported by the base portion 121.

In the present preferred embodiment, the plurality of beams 124 is rotationally symmetric relative to the center of the membrane portion 122 when viewed from the normal direction. With this, when the membrane portion 122 is driven, each of the plurality of beams 124 deforms in the same or substantially the same manner, which makes it possible to reduce or prevent a situation in which the width of the through slit 123 located between the plurality of beams 124 is excessively widened. Consequently, a situation in which ultrasonic waves transmitted and received by the piezoelectric element 120 pass through the through slit 123 may be reduced or prevented.

In the present preferred embodiment, each of the plurality of beams 124 has a triangular or substantially triangular outer shape when viewed from the normal direction, but the outer shape of each of the plurality of beams 124 is not limited to any specific shape. Each of the plurality of beams 124 may have, for example, a polygonal or substantially polygonal outer shape when viewed from the normal direction. Each of the plurality of beams 124 may extend outward from the base portion 121 while being curved. When one end of each of the plurality of beams 124 is supported by the base portion 121, the dimension of the length direction from the one end to the other end of each of the plurality of beams 124 is at least five times or more the dimension of the thickness of the membrane portion 122 so that each of the plurality of beams 124 is able to easily vibrate.

In the present preferred embodiment, the width of the through slit 123 is not greater than about 10 μm, for example. This makes it possible to reduce or prevent a situation in which the width of the through slit 123 located between the plurality of beams 124 is excessively widened when each of the plurality of beams 124 is deformed.

Next, the first through hole 113 provided in the substrate 110 will be described. As illustrated in FIG. 1, the first through hole 113 is provided at a position facing the membrane portion 122. The first through hole 113 extends from the first main surface 111 to the second main surface 112. Thus, a space between the membrane portion 122 and the substrate 110 is connected to a space on the second main surface 112 side of the substrate 110.

As illustrated in FIGS. 1 and 3, in the present preferred embodiment, a boundary X between the membrane portion 122 and the base portion 121 is located at an outer side portion relative to the first through hole 113 when viewed from the normal direction. The first through hole 113 has a circular or substantially circular outer shape when viewed from the normal direction. The first through hole 113 may have, for example, a rectangular or substantially rectangular outer shape when viewed from the normal direction. An aperture size of the first through hole 113 is, for example, in a range from about 0.1 mm to about 1.4 mm.

In the present preferred embodiment, at least a portion of the first through hole 113 may be filled with a porous material. This makes it possible to reduce or prevent a situation in which foreign matter such as dust or water enters into the first main surface 111 side through the first through hole 113 from the external space on the second main surface 112 side. When the porous material is located so as to fill the first through hole 113, the porous material preferably has open cells.

The piezoelectric device 100 according to the present preferred embodiment further includes an annular electrode 144 surrounding the first through hole 113 on the second main surface 112 when viewed from the normal direction. When the piezoelectric device 100 is mounted, the annular electrode 144 is electrically bonded to an electrode provided on the mounting substrate. One of the plurality of first electrodes 141 may be electrically connected to the annular electrode 144 instead of the second electrode 142.

Next, the configuration of each of the base portion 121 and the membrane portion 122 will be described in detail.

As illustrated in FIG. 1, in the present preferred embodiment, the base portion 121 includes a support layer 121a located on a side closest to the substrate 110, a box layer 121b located on the opposite side to the substrate 110 side relative to the support layer 121a, and a multilayer body including a plurality of layers located on the opposite side to the support layer 121a side relative to the box layer 121b.

The support layer 121a is, for example, a single crystal silicon layer, and the box layer 121b is, for example, $SiO_2$. In the present preferred embodiment, the multilayer body extends to an inner side portion of the base portion 121 when viewed from the normal direction, and defines a portion of the membrane portion 122. In the present preferred embodiment, the base portion 121 includes the multilayer body including a piezoelectric layer 122a, an intermediate layer 122d, and an active layer 122e.

As illustrated in FIG. 1, in the present preferred embodiment, the membrane portion 122 at least includes the piezoelectric layer 122a, an upper electrode layer 122b, and a lower electrode layer 122c. In the membrane portion 122, the upper electrode layer 122b faces at least a portion of the lower electrode layer with the piezoelectric layer 122a interposed therebetween in the normal direction.

As the piezoelectric layer 122a, for example, a single crystal piezoelectric layer made of lithium tantalate or lithium niobate may be used. The piezoelectric layer 122a may be made of a rotated Y-cut single crystal piezoelectric material. When the piezoelectric layer 122a is made of a rotated Y-cut single crystal piezoelectric layer made of lithium tantalate or lithium niobate, mechanical characteristics of each of the plurality of beams 124 in the normal direction are different from each other.

The membrane portion 122 further includes the intermediate layer 122d located on the substrate 110 side of the lower electrode layer 122c, and the active layer 122e located on the substrate 110 side of the intermediate layer 122d. The intermediate layer 122d is made of, for example, $SiO_2$. The active layer 122e is made of, for example, a single crystal silicon layer.

The membrane portion 122 includes a stress neutral plane perpendicular or substantially perpendicular to the normal direction. The stress neutral plane of the membrane portion 122 is located at or substantially at the center in the normal direction of the membrane portion 122. In the present preferred embodiment, the piezoelectric layer 122a is located on the opposite side to the substrate 110 side relative to the stress neutral plane of the membrane portion 122. The piezoelectric layer 122a may be located on the substrate 110 side relative to the stress neutral plane of the membrane portion 122.

In the present preferred embodiment, the piezoelectric layer 122a applied with a voltage tends to expand and contract in the in-plane direction perpendicular or substantially perpendicular to the normal direction. Meanwhile, since the layers other than the piezoelectric layer 122a defining the membrane portion 122 are directly or indirectly bonded to the piezoelectric layer 122a, they act on the piezoelectric layer 122a to restrain the expansion and contraction in the in-plane direction of the piezoelectric layer 122a. Since the piezoelectric layer 122a is located on the substrate 110 side or on the opposite side to the substrate 110 side relative to the stress neutral plane of the membrane portion 122, the piezoelectric layer 122a expands and contracts in the in-plane direction while being restrained by other layers, such that the overall membrane portion 122 bends in the normal direction. Since the membrane portion 122 is supported by the base portion 121, the membrane portion 122 vibrates when the membrane portion 122 bends in the normal direction.

As illustrated in FIGS. 1 and 2, in the present preferred embodiment, the piezoelectric element 120 further includes a plurality of pad electrodes 125. The plurality of pad electrodes 125 are electrically connected respectively to the upper electrode layer 122b and the lower electrode layer 122c via connection wiring 126. Each of the plurality of pad electrodes 125 is electrically connected to each of the plurality of first electrodes 141 by being wire-bonded to the plurality of first electrodes 141 with each of a plurality of bonding wires 150.

In the present preferred embodiment, the piezoelectric element 120 is bonded to the substrate 110 by a piezoelectric element bonding portion 129 located between the base portion 121 and the first main surface 111. The piezoelectric element bonding portion 129 is made of an adhesive such as, for example, a die bonding agent.

As illustrated in FIGS. 1 and 3, in the present preferred embodiment, the base portion 121 is bonded to the first main surface 111 of the substrate 110 without a gap over the entire or substantially the entire circumference of the base portion 121 when viewed from the normal direction by the piezoelectric element bonding portion 129. The piezoelectric element bonding portion 129 has liquid-tightness. Accordingly, as for a bonding interface between the piezoelectric element 120 and the substrate 110, an inside portion of the base portion 121 and an outside portion of the base portion 121 when viewed from the normal direction may be acoustically isolated from each other. In the present preferred embodiment, the entirety or substantially the entirety of the surface on the substrate 110 side of the base portion 121 is bonded to the first main surface 111 of the substrate 110 via the piezoelectric element bonding portion 129.

In a case where a portion of the base portion 121 and the first main surface 111 of the substrate 110 are bonded to each other by the piezoelectric element bonding portion 129, an additional die bonding material or another member may be additionally supplied to fill the gap between the base portion 121 and the first main surface 111 of the substrate 110. Thus, as for the bonding interface between the piezoelectric element 120 and the substrate 110, the inside portion of the base portion 121 and the outside portion of the base portion 121 may be acoustically isolated from each other.

As illustrated in FIG. 1, in the present preferred embodiment, the piezoelectric element 120 has a rectangular or substantially rectangular outer shape when viewed from the normal direction. When viewed from the normal direction, the length of one side of the piezoelectric element 120 is in a range from about 0.6 mm to about 1.5 mm, for example. The thickness in the normal direction of the piezoelectric element 120 is, for example, in a range from about 0.2 mm to about 0.5 mm.

In the present preferred embodiment, the piezoelectric element 120 is a micro electro mechanical systems (MEMS) element. In the present preferred embodiment, the piezoelectric element 120 is able to emit ultrasonic waves or receive ultrasonic waves by vibrating the membrane portion 122 at a relatively low frequency. In the present preferred embodiment, specific frequencies of these ultrasonic waves are in a range from about 20 kHz to about 60 kHz, for example.

As illustrated in FIG. 1, the lid 130 is located on the first main surface 111. In the present preferred embodiment, the lid 130 has the same or substantially the same outer shape as that of the substrate 110 when viewed from the normal direction.

The lid 130 covers the piezoelectric element 120 while being spaced apart from the piezoelectric element 120 on the first main surface 111 side. The lid 130 does not make contact with any of the plurality of bonding wires 150.

In the present preferred embodiment, the lid 130 is an integral member and includes a case portion 131 including a recess shape on the substrate 110 side. The thickness of the lid 130 is, for example, in a range from about 0.1 mm to about 0.3 mm.

In the present preferred embodiment, the lid 130 and the substrate 110 are bonded to each other by a bonding portion 132 having liquid-tightness. In the present preferred embodiment, the lid 130 is bonded to the first main surface 111 without a gap over the entire or substantially the entire outer circumference end of the lid by the bonding portion 132 when viewed from the normal direction. Thus, the internal space on the piezoelectric element 120 side and the external space on the opposite side to the internal space relative to the bonding portion 132, are acoustically isolated or substantially acoustically isolated from each other. As the bonding portion 132, for example, a known adhesive of the related art may be used.

In the present preferred embodiment, the lid 130 is made of a metal material or a resin material. The lid 130 may be molded by cutting or pressing a member made of the above-described material, or may be molded by molding.

As illustrated in FIG. 1, in the piezoelectric device 100 according to Preferred Embodiment 1 of the present invention, by applying a voltage to each of the plurality of second electrodes 142, a voltage is applied between the upper electrode layer 122b and lower electrode layer 122c, which are electrically connected to each of the plurality of second electrodes 142. As a result, the piezoelectric layer 122a located between the upper electrode layer 122b and the lower electrode layer 122c is driven. When the piezoelectric layer 122a is driven, the membrane portion 122 vibrates to generate ultrasonic waves 1. The ultrasonic waves 1 are emitted from the first through hole 113 to the external space.

In a case where sound waves such as ultrasonic waves are received by the piezoelectric device 100, the ultrasonic waves pass through the first through hole 113 from the external space and reach the membrane portion 122, thus vibrating the membrane portion 122. Thus, the piezoelectric layer 122a is driven. A potential difference is generated between the upper electrode layer 122b and the lower electrode layer 122c sandwiching the driven piezoelectric layer 122a from both sides thereof. This potential difference may be detected by the plurality of second electrodes 142 electrically connected to each of the upper electrode layer 122b and the lower electrode layer 122c. In this manner, the piezoelectric device 100 according to the present preferred embodiment may receive ultrasonic waves.

Figure 4:
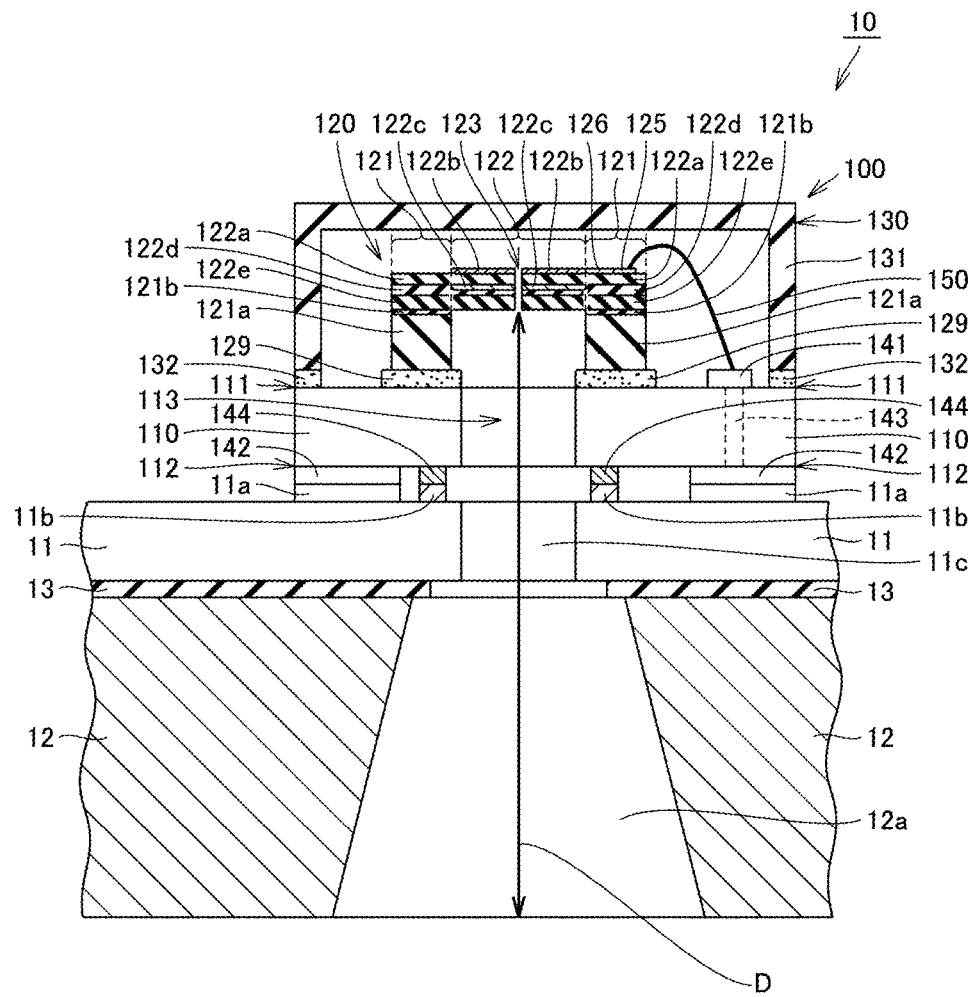
FIG. 4 is a sectional view illustrating an ultrasonic transducer according to Preferred Embodiment 1 of the present invention.

Next, an ultrasonic transducer according to Preferred Embodiment 1 of the present invention will be described. FIG. 4 is a sectional view illustrating a configuration of an ultrasonic transducer according to Preferred Embodiment 1 of the present invention.

As illustrated in FIG. 4, an ultrasonic transducer 10 according to Preferred Embodiment 1 of the present invention includes a mounting substrate 11, the piezoelectric device 100 mounted on the mounting substrate 11, and a housing 12.

The mounting substrate 11 faces the second main surface 112. To be specific, each of the plurality of second electrodes 142 located on the second main surface 112 is electrically connected to each of third electrodes 11a on the mounting substrate 11.

A third through hole 11c is provided in the mounting substrate 11. An end portion on the piezoelectric device 100 side of the third through hole 11c is located at a position facing the first through hole 113. In the present preferred embodiment, the third through hole 11c linearly extends from a surface on the piezoelectric device 100 side of the mounting substrate 11 to a surface thereof on the opposite side to the piezoelectric device 100 side.

On the surface on the piezoelectric device 100 side of the mounting substrate 11, a corresponding annular electrode 11b surrounds the third through hole 11c when viewed from the normal direction. The corresponding annular electrode 11b is electrically connected to the annular electrode 144 of the piezoelectric device 100. As a result, it is possible to reduce or prevent a situation in which the ultrasonic waves pass through between the piezoelectric device 100 and the mounting substrate 11 to the outside when the ultrasonic waves pass through between the first through hole 113 and the third through hole 11c.

As illustrated in FIG. 4, the housing 12 houses the mounting substrate 11 and the piezoelectric device 100. In FIG. 4, only a portion facing the mounting substrate 11 is shown. A fourth through hole 12a facing the third through hole 11c is provided in the housing 12. In the present preferred embodiment, the hole size of the fourth through hole 12a increases as the through hole extends from the mounting substrate 11 side towards a side opposite to the mounting substrate 11 side.

In Preferred Embodiment 1 of the present invention, a distance D from the membrane portion 122, through the first through hole 113, the third through hole 11c, and the fourth through hole 12a, to an end portion of the fourth through hole 12a on the opposite side to the piezoelectric device 100 side is in a range from about 1.28 mm to about 4.17 mm, for example.

The numerical value range of the distance D is set as follows. In Preferred Embodiment 1 of the present invention, the distance D is set such that air column resonance is produced in a region from an end surface on the substrate 110 side of the membrane portion 122 to the end portion of the fourth through hole 12a on the opposite side to the piezoelectric device 100 side. That is, the distance D is set to satisfy the relationship of Equation (1) below. In the following Equation (1), "f" represents a frequency of ultrasonic waves to be transmitted and received, "c" represents an acoustic velocity, and "a" represents an average value of a hole size when a section from a portion on the substrate 110 side of the membrane portion 122 to the end portion of the fourth through hole 12a on the opposite side to the piezoelectric devices 100 side is viewed as a single through hole. In the following Equation (1), an aperture end correction is made by adding (8a/3π) to the distance D.

$$\frac{c}{4f} = D + \frac{8a}{3\pi} \quad (1)$$

In Equation (1) described above, the distance D to be set decreases as the frequency f of the ultrasonic waves to be transmitted and received increases, and the distance D to be set increases as the frequency f decreases. The distance D to be set decreases as the average value a of the hole size increases, and the distance D to be set increases as the average value a of the hole size decreases.

In the present preferred embodiment, the frequency f of the ultrasonic waves transmitted and received is in a range from about 20 kHz to about 50 kHz, for example, and the average value a of the hole size is in a range from about 0.1 mm to about 0.5 mm, for example. When the frequency f is at a maximum about 50 kHz, and the average value a of the hole size is at a maximum about 0.5 mm, the distance D is preferably about 1.28 mm based on the above Equation (1). When the frequency f is at a minimum about 20 kHz, and the average value a of the hole size is at a minimum about 0.1 mm, the distance D is preferably about 4.17 mm based on the above Equation (1). Accordingly, in the present preferred embodiment, the distance D is preferably in a range from about 1.28 mm to about 4.17 mm, for example.

Between the mounting substrate 11 and the housing 12, a housing connection member 13 is located at a position that does not block any of the third through hole 11c and the fourth through hole 12a. The housing connection member 13 fixes a conductive position of the mounting substrate 11 with respect to the housing 12. The housing connection member 13 is, for example, a sealing material or a gasket. The housing connection member 13 surrounds the third through hole 11c when viewed from the normal direction.

As described above, in the piezoelectric device 100 according to Preferred Embodiment 1 of the present invention, the first through hole 113 extending from the first main surface 111 to the second main surface 112 is provided in the substrate 110 at a position facing the membrane portion 122. The through slit 123 is provided in the membrane portion 122.

By providing the through slit 123, residual stress in the piezoelectric layer 122a is reduced. By reducing the residual stress in the piezoelectric layer 122a, the membrane portion 122 may vibrate at a relatively low frequency. This makes it possible for the piezoelectric element 120 to transmit and receive ultrasonic waves of a relatively low frequency. Consequently, because ultrasonic waves of a relatively low frequency have a relatively long wavelength, a reduction in the amount of amplification by resonance caused by a dimensional error in the length of the first through hole 113, is unlikely to occur. As described above, in the present preferred embodiment, the formation of the through slit 123 may improve device characteristics of the piezoelectric device 100.

In the present preferred embodiment, since the through slit 123 is provided, the membrane portion 122 includes the plurality of beams 124. One end of each of the plurality of beams 124 is supported by the base portion 121.

This increases the amount of deformation of each of the plurality of beams 124 during the vibration of the membrane portion 122, thus making it possible to further improve the device characteristics of the piezoelectric device 100. In addition, the binding force by the base portion 121 is smaller in each of the plurality of beams 124 than that in the beam whose both ends are supported by the base portion 121. This makes it possible to further lower the frequency of the ultrasonic waves that the piezoelectric device 100 is able to transmit and receive.

In the present preferred embodiment, the lid 130 and the substrate 110 are bonded to each other by the bonding portion 132 having liquid-tightness.

This makes it possible to reduce or prevent a situation in which the ultrasonic waves transmitted and received by the vibration of the membrane portion 122 pass through between the lid 130 and the substrate 110. As a result, it is possible to reduce or prevent a situation in which the beam near the portion through which the ultrasonic waves are allowed to pass and the beam located separate from the above portion vibrate with mutually different deformation amounts and at mutually different frequencies.

In the present preferred embodiment, the boundary X between the membrane portion 122 and the base portion 121 is located at an outer side portion relative to the first through hole 113 when viewed from the normal direction.

With this configuration, since the entire or substantially the entire end surface of the base portion 121 is bonded to the first main surface 111 of the substrate 110, it is possible to further reduce or prevent a situation in which the ultrasonic waves 1 pass through between the base portion 121 and the substrate 110. In addition, the piezoelectric element 120 may be more firmly fixed to the substrate 110.

The piezoelectric device 100 according to the present preferred embodiment further includes the annular electrode 144 surrounding the first through hole 113 on the second main surface 112 when viewed from the normal direction.

This makes it possible to bond the annular electrode 144 to the corresponding annular electrode 11b of the mounting substrate 11 when the piezoelectric device 100 is mounted on the mounting substrate 11. As a result, it is possible to reduce or prevent a situation in which the ultrasonic waves pass through between the piezoelectric device 100 and the mounting substrate 11.

In the ultrasonic transducer 10 according to Preferred Embodiment 1 of the present invention, the third through hole 11c is provided in the mounting substrate 11. An end portion on the piezoelectric device 100 side of the third through hole 11c is located at a position facing the first through hole 113.

Thus, by using the third through hole 11c of the mounting substrate 11 in addition to the first through hole 113, it is possible to produce resonance of ultrasonic waves having a relatively long wavelength, that is, ultrasonic waves having a relatively low frequency among the ultrasonic waves that the piezoelectric element 120 is able to transmit and receive.

The ultrasonic transducer 10 according to Preferred Embodiment 1 of the present invention further includes the housing 12 configured to house the mounting substrate 11 and the piezoelectric device 100. The fourth through hole 12a facing the third through hole 11c is provided in the housing 12.

Thus, by using the fourth through hole 12a in addition to the first through hole 113 and the third through hole 11c, it is possible to produce resonance of ultrasonic waves having a longer wavelength, that is, ultrasonic waves having a lower frequency among the ultrasonic waves that the membrane portion 122 is able to transmit and receive.

In Preferred Embodiment 1 of the present invention, the distance from the membrane portion 122, through the first through hole 113, the third through hole 11c, and the fourth through hole 12a, to an end portion of the fourth through hole 12a on the opposite side to the piezoelectric device 100 side is in a range from about 1.28 mm to about 4.17 mm, for example.

This makes it possible to produce the resonance of ultrasonic waves of a relatively low frequency, which is unable to be produced by only the first through hole 113 in the existing piezoelectric device.

Next, piezoelectric devices according to first to fourth modifications of Preferred Embodiment 1 of the present invention will be described. The configuration of a first through hole of a piezoelectric device according to each of the first to fourth modifications of Preferred Embodiment 1 of the present invention is different from that of the piezoelectric device 100 according to Preferred Embodiment 1 of the present invention.

Figure 5:
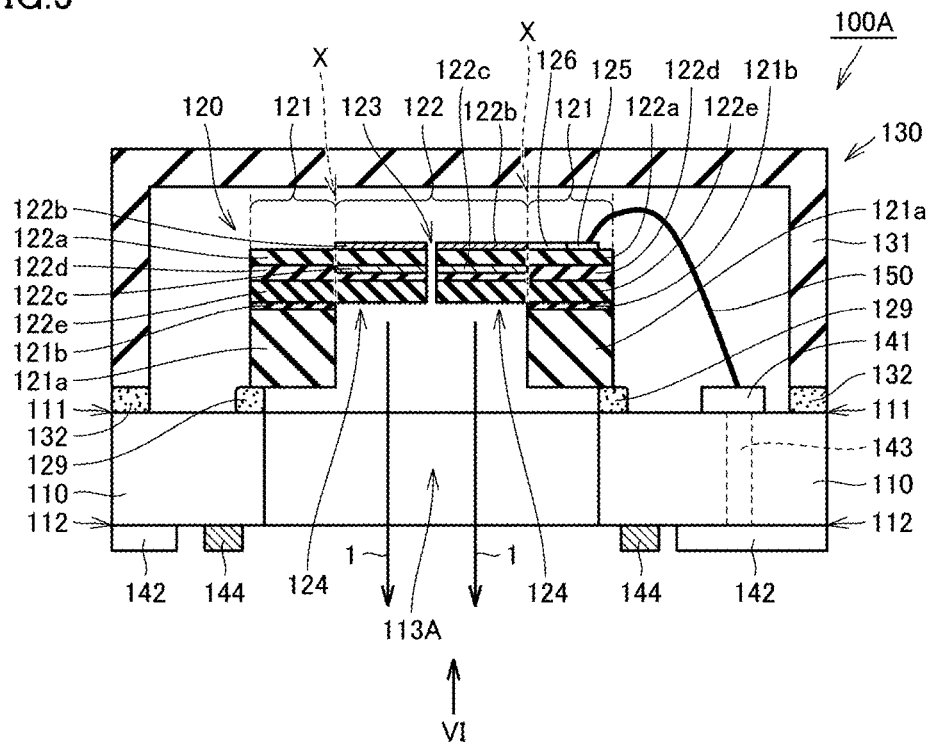
FIG. 5 is a sectional view illustrating a piezoelectric device according to a first modification of Preferred Embodiment 1 of the present invention.
Figure 6:
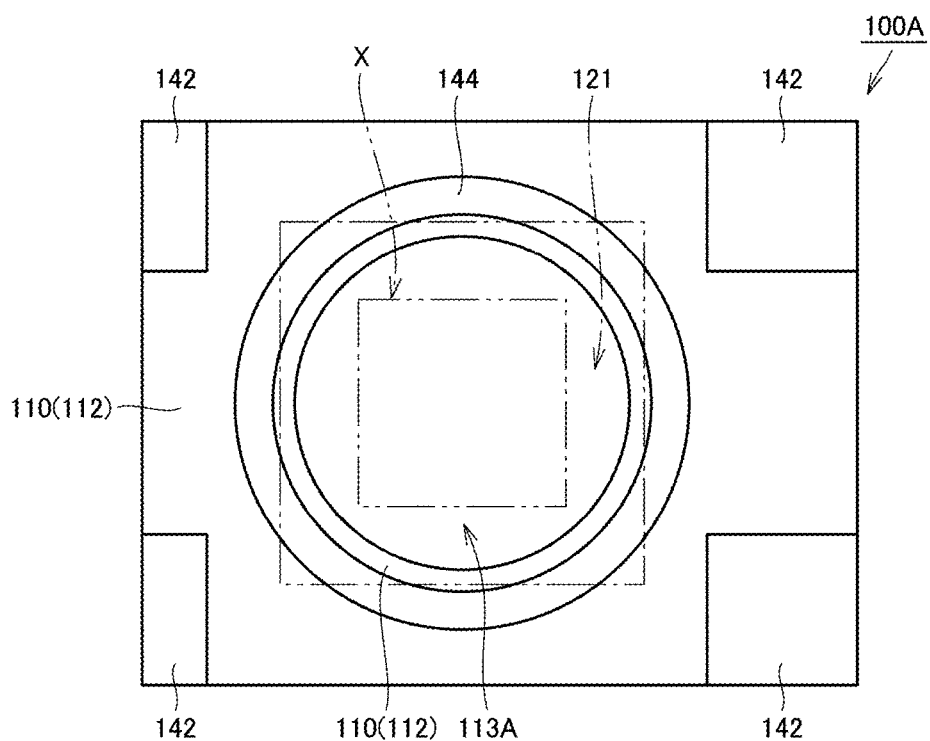
FIG. 6 is a bottom view illustrating the piezoelectric device when the piezoelectric device illustrated in FIG. 5 is seen from an arrow VI direction.

FIG. 5 is a sectional view illustrating a piezoelectric device according to a first modification of Preferred Embodiment 1 of the present invention. FIG. 6 is a bottom view illustrating the configuration of the piezoelectric device when the piezoelectric device illustrated in FIG. 5 is seen from an arrow VI direction.

As illustrated in FIGS. 5 and 6, in a piezoelectric device 100A according to the first modification of Preferred Embodiment 1 of the present invention, a boundary X between a membrane portion 122 and a base portion 121 is located at an inner side portion relative to an outer shape of a first through hole 113A when viewed from the normal direction. When viewed from the normal direction, an outer circumferential edge of a piezoelectric element 120 is located at an outer side portion relative to the first through hole 113A.

With this, even when a dimensional error occurs in a relative positional relationship between the first through hole 113A and the base portion 121 of the piezoelectric element 120, it is possible to reduce or prevent a situation in which ultrasonic waves 1 transmitted and received in the membrane portion 122 are blocked by a substrate 110. In the present modification, since the membrane portion 122 includes a plurality of beams 124, it is possible to reduce or prevent a situation in which the above-described dimensional error occurs and a portion of the ultrasonic waves 1 is blocked by the substrate 110, so that a load is increased in only a portion of the plurality of beams 124.

Figure 7:
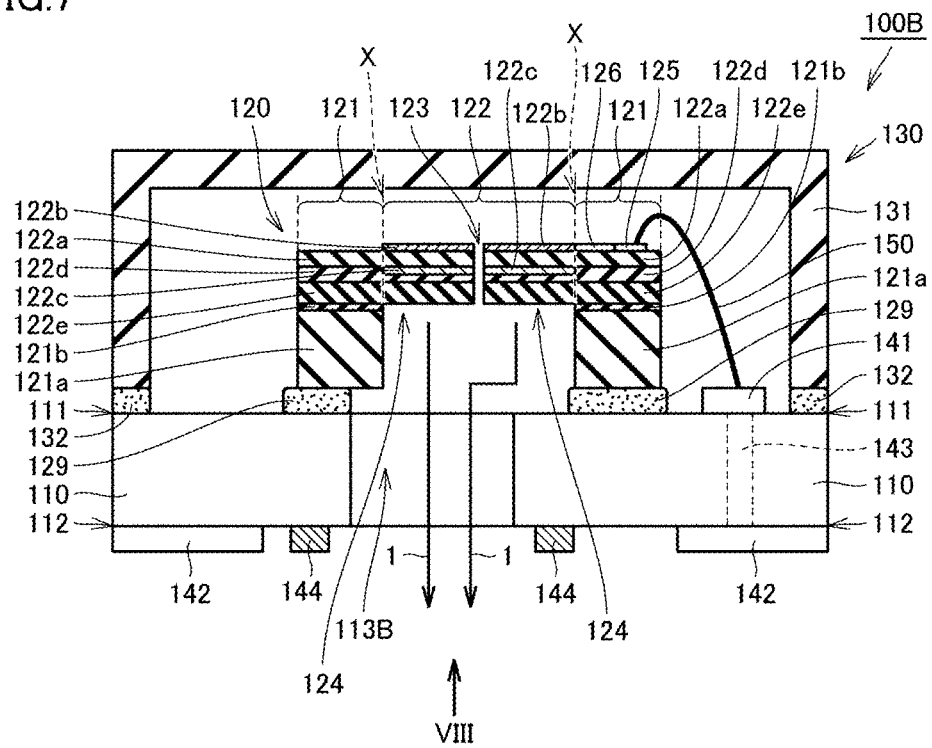
FIG. 7 is a sectional view illustrating a piezoelectric device according to a second modification of Preferred Embodiment 1 of the present invention.
Figure 8:
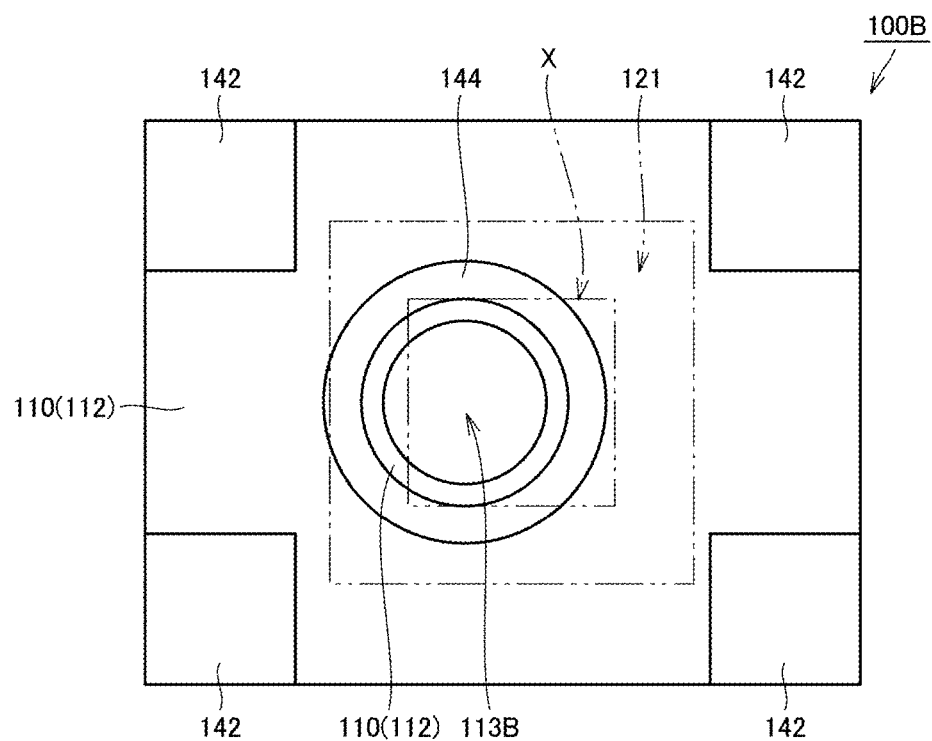
FIG. 8 is a bottom view illustrating the piezoelectric device when the piezoelectric device illustrated in FIG. 7 is seen from an arrow VIII direction.

FIG. 7 is a sectional view illustrating a piezoelectric device according to a second modification of Preferred Embodiment 1 of the present invention. FIG. 8 is a bottom view illustrating the configuration of the piezoelectric device when the piezoelectric device illustrated in FIG. 7 is seen from an arrow VIII direction.

As illustrated in FIGS. 7 and 8, in a piezoelectric device 100B according to the second modification of Preferred Embodiment 1 of the present invention, a boundary X between a membrane portion 122 and a base portion 121 overlaps a first through hole 113B when viewed from the normal direction.

In the present modification, similar to Preferred Embodiment 1 of the present invention, since a through slit 123 is provided in the membrane portion 122, the frequency of ultrasonic waves 1 capable of being transmitted and received may be lowered. However, as illustrated in FIG. 7, since the boundary X between the membrane portion 122 and the base portion 121 overlaps the first through hole 113B in the normal direction, a portion of the ultrasonic waves 1 is blocked by a substrate 110.

Figure 9:
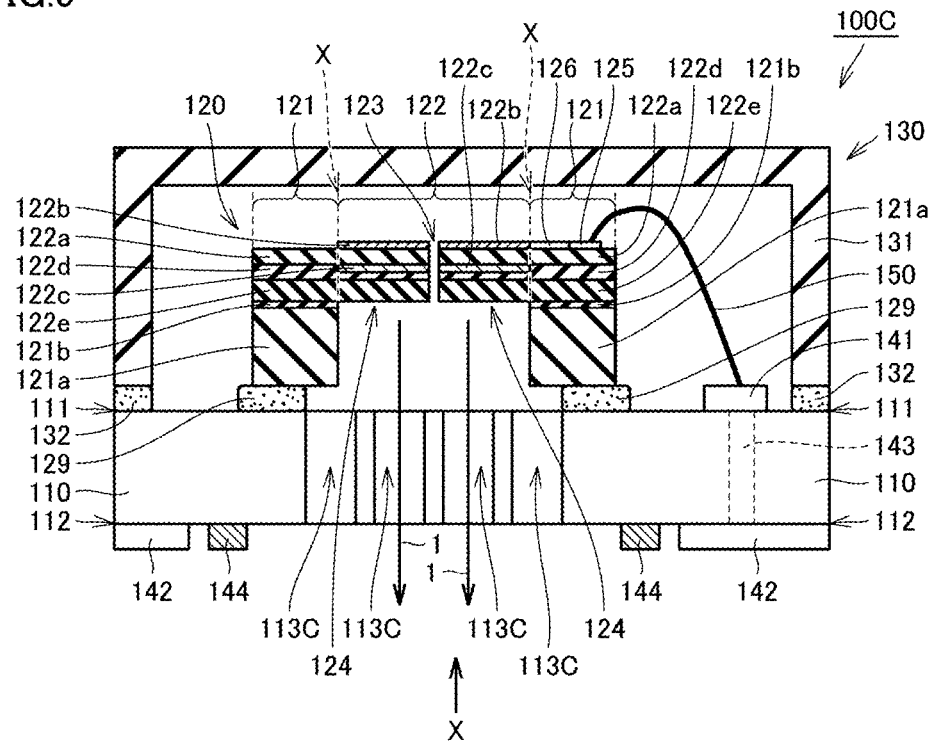
FIG. 9 is a sectional view illustrating a piezoelectric device according to a third modification of Preferred Embodiment 1 of the present invention.
Figure 10:
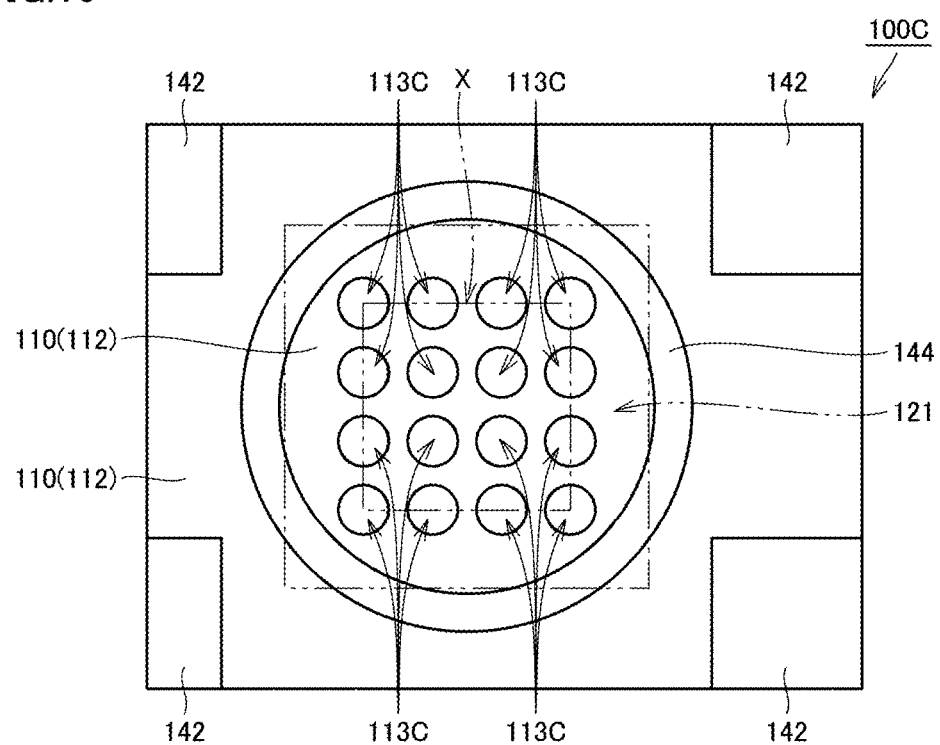
FIG. 10 is a bottom view illustrating the piezoelectric device when the piezoelectric device illustrated in FIG. 9 is seen from an arrow X direction.

FIG. 9 is a sectional view illustrating a piezoelectric device according to a third modification of Preferred Embodiment 1 of the present invention. FIG. 10 is a bottom view illustrating the configuration of the piezoelectric device when the piezoelectric device illustrated in FIG. 9 is seen from an arrow X direction.

As illustrated in FIGS. 9 and 10, in a piezoelectric device 100C according to the third modification of Preferred Embodiment 1 of the present invention, a plurality of first through holes 113C are provided. When viewed from the normal direction, the plurality of first through holes 113C are arranged in a matrix shape at equal or substantially equal intervals in a region of a substrate 110 corresponding to a membrane portion 122.

This makes it possible to reduce the hole size for each of the plurality of first through holes 113C while making the load in each portion of the membrane portion 122 uniform, and thus it is possible to reduce or prevent a situation in which foreign matter such as dust or moisture enters into between the substrate 110 and a piezoelectric element 120.

In the present modification, when viewed from the normal direction, of the plurality of first through holes 113C, the center of each of the plurality of first through holes 113C on the outermost peripheral side is located along a boundary X between the membrane portion 122 and the base portion 121. With this configuration, even when a slight dimensional error occurs in a position of the membrane portion 122 with respect to the plurality of first through holes 113C, it is possible to reduce or prevent a situation in which ultrasonic waves 1 transmitted and received in the membrane portion 122 are blocked by the substrate 110. In the present modification, since the membrane portion 122 includes a plurality of beams 124, it is possible to reduce or prevent a situation in which the dimensional error occurs and a portion of the ultrasonic waves 1 is blocked by the substrate 110, so that a load is increased in only a portion of the plurality of beams 124.

Figure 11:
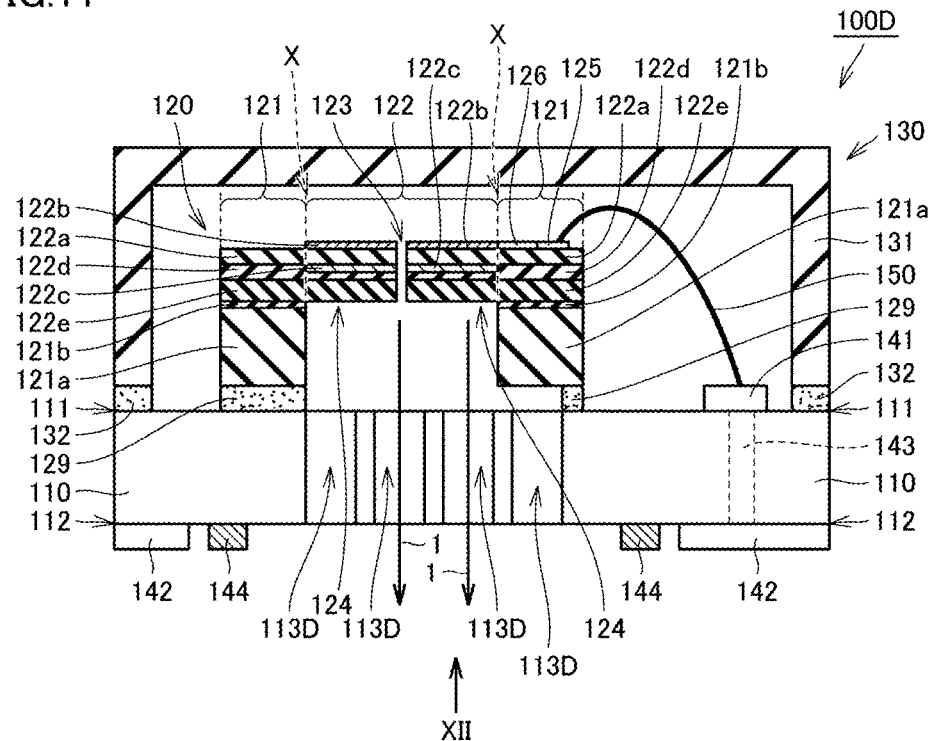
FIG. 11 is a sectional view illustrating a piezoelectric device according to a fourth modification of Preferred Embodiment 1 of the present invention.
Figure 12:
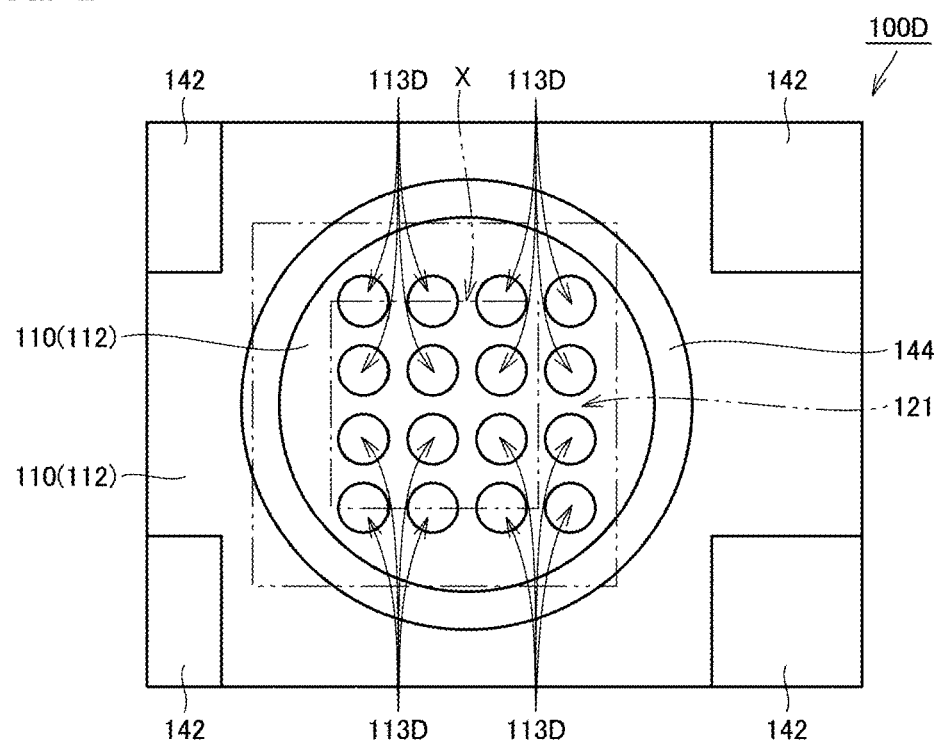
FIG. 12 is a bottom view illustrating the piezoelectric device when the piezoelectric device illustrated in FIG. 11 is seen from an arrow XII direction.

FIG. 11 is a sectional view illustrating a piezoelectric device according to a fourth modification of Preferred Embodiment 1 of the present invention. FIG. 12 is a bottom view illustrating the configuration of the piezoelectric device when the piezoelectric device illustrated in FIG. 11 is seen from an arrow XII direction.

As illustrated in FIGS. 11 and 12, in a piezoelectric device 100D according to the fourth modification of Preferred Embodiment 1 of the present invention, a plurality of first through holes 113D are provided as in the configuration of the piezoelectric device according to the third modification of Preferred Embodiment 1 of the present invention. When viewed from the normal direction, the plurality of first through holes 113D are arranged in a matrix shape at equal or substantially equal intervals in a region of a substrate 110 corresponding to a membrane portion 122. This makes it possible to reduce or prevent a situation in which, while making the load in each portion of the membrane portion 122 uniform, foreign matter such as dust or moisture enters into between the substrate 110 and a piezoelectric element 120.

In the fourth modification of Preferred Embodiment 1 of the present invention, of the plurality of first through holes 113D, some of the plurality of first through holes 113D on the outermost peripheral side are located at an inner side portion relative to a boundary X between the membrane portion 122 and a base portion 121 when viewed from the normal direction.

Next, a piezoelectric device according to a fifth modification of Preferred Embodiment 1 of the present invention will be described. The configuration of a membrane portion of a piezoelectric element of a piezoelectric device according to the fifth modification of the present invention is different from that of the piezoelectric device 100 according to Preferred Embodiment 1 of the present invention.

Figure 13:
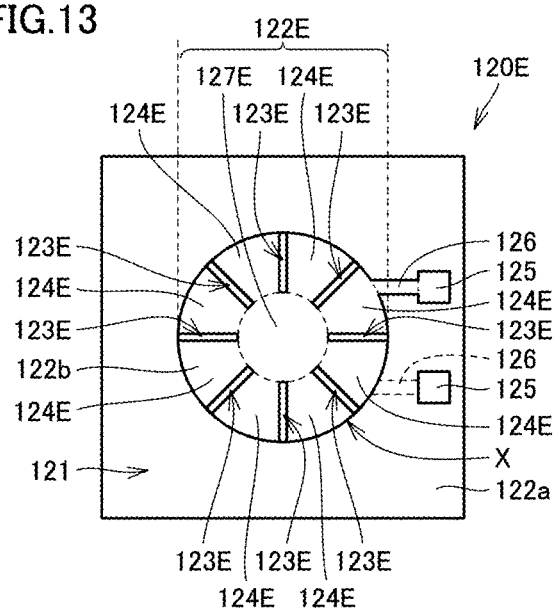
FIG. 13 is a plan view illustrating a piezoelectric element according to a fifth modification of Preferred Embodiment 1 of the present invention.

FIG. 13 is a plan view illustrating a piezoelectric element in the fifth modification of Preferred Embodiment 1 of the present invention. In FIG. 13, a piezoelectric element is shown being viewed from the same direction as that in FIG. 2.

As illustrated in FIG. 13, in a piezoelectric element 120E in the fifth modification of Preferred Embodiment 1 of the present invention, a membrane portion 122E has a circular or substantially circular outer shape when viewed from the normal direction. In the present modification, a plurality of through slits 123E are provided in the membrane portion 122E. The plurality of through slits 123E are aligned at equal or substantially equal intervals in a circumferential direction about the center of the membrane portion 122E when viewed from the normal direction. Each of the plurality of through slits 123E extends from a boundary X between a base portion 121 and the membrane portion 122E toward the center of the membrane portion 122E. Thus, in the present modification, a circular plate 127E is provided at the center of the membrane portion 122E.

In the present modification, each of a plurality of beams 124E is supported by the base portion 121 at one end thereof, and is connected to the plate 127E at the other end thereof. Similar to the piezoelectric device 100 according to Preferred Embodiment 1 of the present invention, in the present modification, the piezoelectric element 120E is able to transmit and receive ultrasonic waves of a relatively low frequency by the plate 127E vibrating together with the plurality of beams 124E.

Next, an ultrasonic transducer according to a sixth modification of Preferred Embodiment 1 of the present invention will be described. An ultrasonic transducer according to the sixth modification of Preferred Embodiment 1 of the present invention is different from the ultrasonic transducer according to Preferred Embodiment 1 of the present invention in the configuration of a third through hole.

Figure 14:
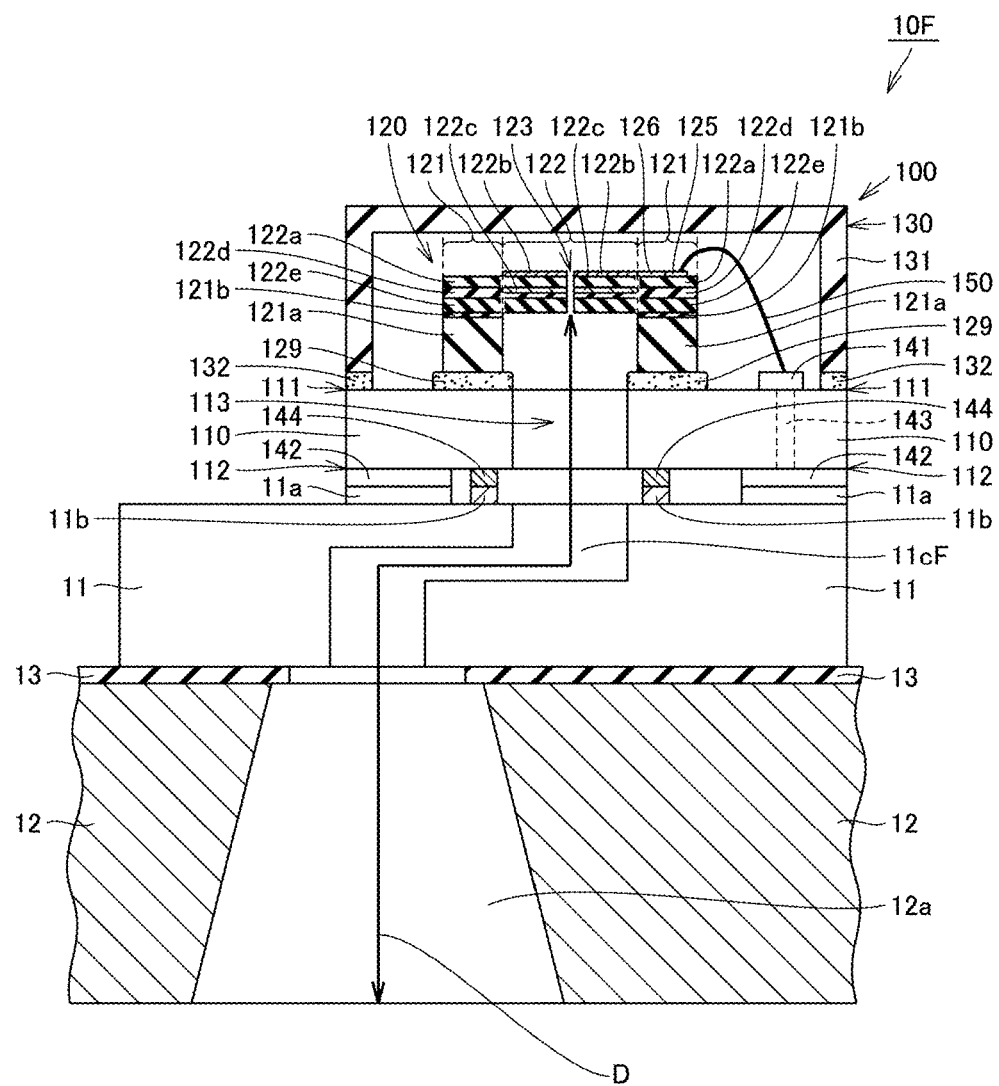
FIG. 14 is a sectional view illustrating an ultrasonic transducer according to a sixth modification of Preferred Embodiment 1 of the present invention.

FIG. 14 is a sectional view illustrating the configuration of an ultrasonic transducer according to the sixth modification of Preferred Embodiment 1 of the present invention. As illustrated in FIG. 14, in an ultrasonic transducer 10F according to the sixth modification of Preferred Embodiment 1 of the present invention, a third through hole 11cF extends from a surface of a mounting substrate 11 on the side of a piezoelectric device 100, through a bent path, to a surface thereof on the opposite side to the piezoelectric device 100 side. This makes it possible to lengthen a distance D from a membrane portion 122, through a first through hole 113, the third through hole 11cF, and a fourth through hole 12a, to an end portion of the fourth through hole 12a on the opposite side to the piezoelectric device 100 side while thinning the thickness of the mounting substrate 11.

Preferred Embodiment 2

Hereinafter, a piezoelectric device according to Preferred Embodiment 2 of the present invention will be described. A piezoelectric device according to the present preferred embodiment of the present invention differs from the piezoelectric device 100 according to Preferred Embodiment 1 of the present invention mainly in the configuration of a lid. Because of this, the description of the configuration the same as or similar to that of the piezoelectric device 100 according to Preferred Embodiment 1 of the present invention will not be repeated.

Figure 15:
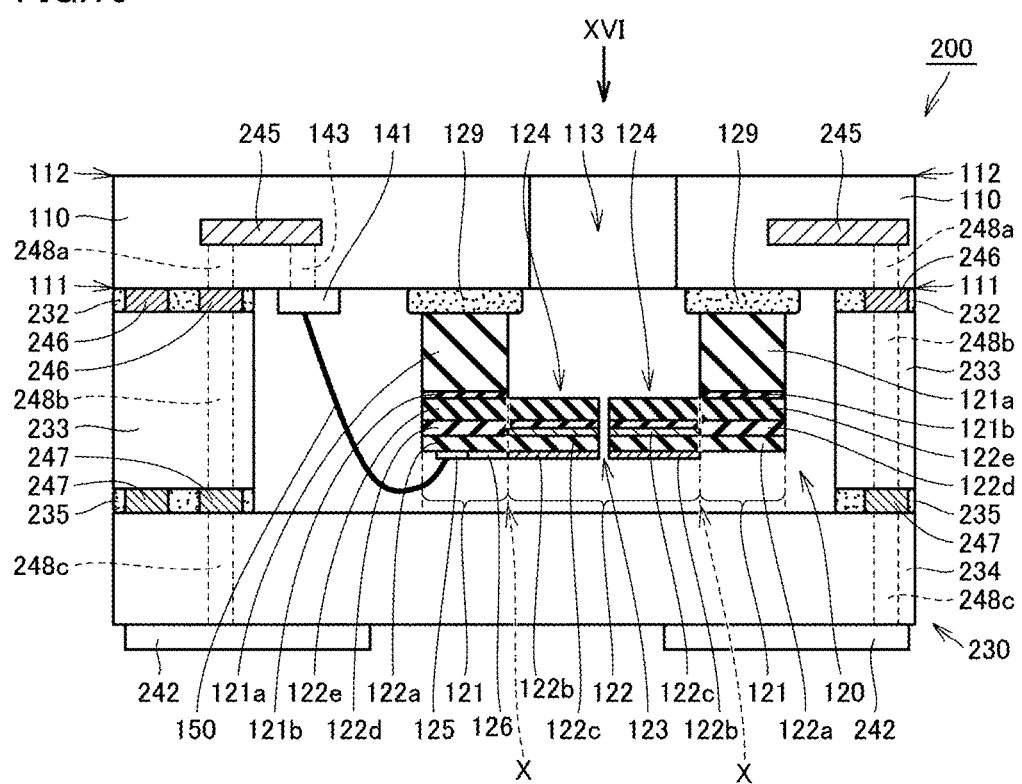
FIG. 15 is a sectional view illustrating a piezoelectric device according to Preferred Embodiment 2 of the present invention.
Figure 16:
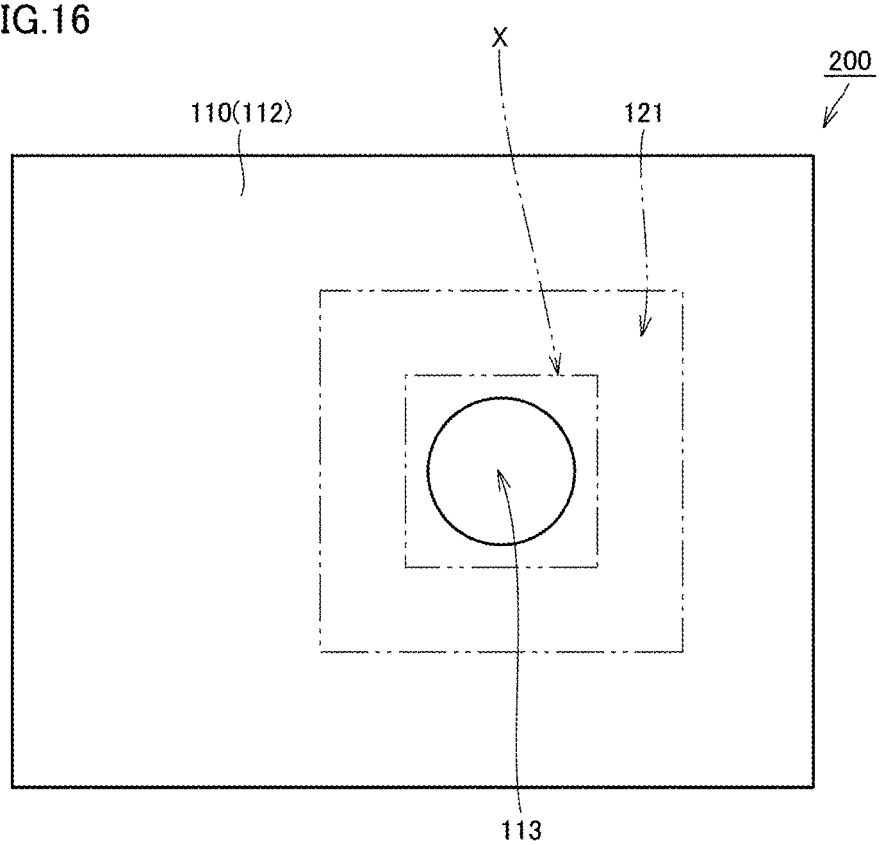
FIG. 16 is a plan view when the piezoelectric device illustrated in FIG. 15 is seen from an arrow XVI direction.

FIG. 15 is a sectional view illustrating a piezoelectric device according to Preferred Embodiment 2 of the present invention. FIG. 16 is a plan view when the piezoelectric device illustrated in FIG. 15 is seen from an arrow XVI direction.

As illustrated in FIGS. 15 and 16, in a piezoelectric device 200 according to Preferred Embodiment 2 of the present invention, a lid 230 includes a frame portion 233 and a bottom plate 234.

The frame portion 233 has a rectangular or substantially rectangular annular outer shape when viewed from the normal direction. The thickness of a frame of the frame portion 233 is, for example, in a range from about 0.5 mm to about 1.0 mm. A plurality of fourth electrodes 246 are provided on a surface of the frame portion 233 on the side of a substrate 110. A plurality of fifth electrodes 247 are provided on a surface of the frame portion 233 on the opposite side to the substrate 110 side. The fourth electrode 246 and the fifth electrode 247 are electrically connected to each other by a second relay via electrode 248b. The second relay via electrode 248b extends through from a surface on the substrate 110 side of the frame portion 233 to a surface on the opposite side to the substrate 110 side.

Each of the plurality of fourth electrodes 246 may have an annular shape over the entire or substantially the entire circumference of the frame portion 233 when viewed from the normal direction. At this time, each of the plurality of fourth electrodes 246 may be bonded to the substrate 110 by soldering or welding, for example. Thus, the internal space on the side of a piezoelectric element 120 and the external space on the opposite side to the internal space relative to the fourth electrode 246, may be acoustically isolated or substantially acoustically isolated from each other.

The frame portion 233 may include a substrate capable of being used as the substrate 110. In a case where the frame portion 233 includes a substrate made of a ceramic material, the frame portion 233 is formed by processing the ceramic material before being fired into a desired shape, and then firing the ceramic material.

In the present preferred embodiment, the frame portion 233 and the substrate 110 are bonded to each other by a bonding portion 232 having liquid-tightness.

The fourth electrode 246 is electrically connected to each of a plurality of first electrodes 141. Specifically, each of the plurality of first electrodes 141 is electrically connected to an internal electrode 245 located inside the substrate 110 by a via electrode 143. In the present preferred embodiment, the via electrode 143 does not extend to a second main surface 112. The internal electrode 245 is electrically connected to the fourth electrode 246 by a first relay via electrode 248a. The fourth electrode 246 and the first relay via electrode 248a are bonded to each other with a conductive adhesive or solder, for example.

The bottom plate 234 is a plate-shaped member. The bottom plate 234 has the same or substantially the same outer shape as that of the substrate 110 when viewed from the normal direction, except that the bottom plate 234 does not include a through hole. The thickness of the bottom plate 234 is, for example, in a range from about 0.1 mm to about 0.3 mm.

A plurality of second electrodes 242 are spaced apart from each other on a surface of the bottom plate 234 on the opposite side to the substrate 110 side. That is, in the present preferred embodiment, the plurality of second electrodes is not located on a second main surface 112. Each of the plurality of second electrodes 242 and each of the plurality of fifth electrodes 247 on the frame portion 233 are electrically connected to each other by a third relay via electrode 248c. The third relay via electrode 248c extends through from a surface on the substrate 110 side of the bottom plate 234 to a surface on the opposite side to the substrate 110 side. The third relay via electrode 248c and each of the fifth electrodes 247 are bonded to each other with a conductive adhesive or solder.

In the present preferred embodiment, the frame portion 233 and the bottom plate 234 are bonded to each other by an intermediate bonding portion 235 having liquid-tightness. As the intermediate bonding portion 235, a known adhesive of the related art may be used.

The fifth electrode 247 may have an annular shape over the entire or substantially the entire circumference of the frame portion 233 when viewed from the normal direction. At this time, the fifth electrode 247 may be bonded to the bottom plate 234 by soldering or welding, for example. Thus, the internal space on the piezoelectric element 120 side and the external space on the opposite side to the internal space relative to the fifth electrode 247, may be acoustically isolated or substantially acoustically isolated from each other.

In other words, in the present preferred embodiment, by applying a voltage to each of the plurality of second electrodes 242, a voltage is applied between an upper electrode layer 122b and a lower electrode layer 122c via the third relay via electrode 248c, the fifth electrode 247, the second relay via electrode 248b, the fourth electrode 246, the first relay via electrode 248a, the internal electrode 245, the via electrode 143, and the first electrode 141. A potential difference generated between the upper electrode layer 122b and the lower electrode layer 122c may be detected by the plurality of second electrodes 242 via the plurality of electrodes and plurality of via electrodes discussed above.

Figure 17:
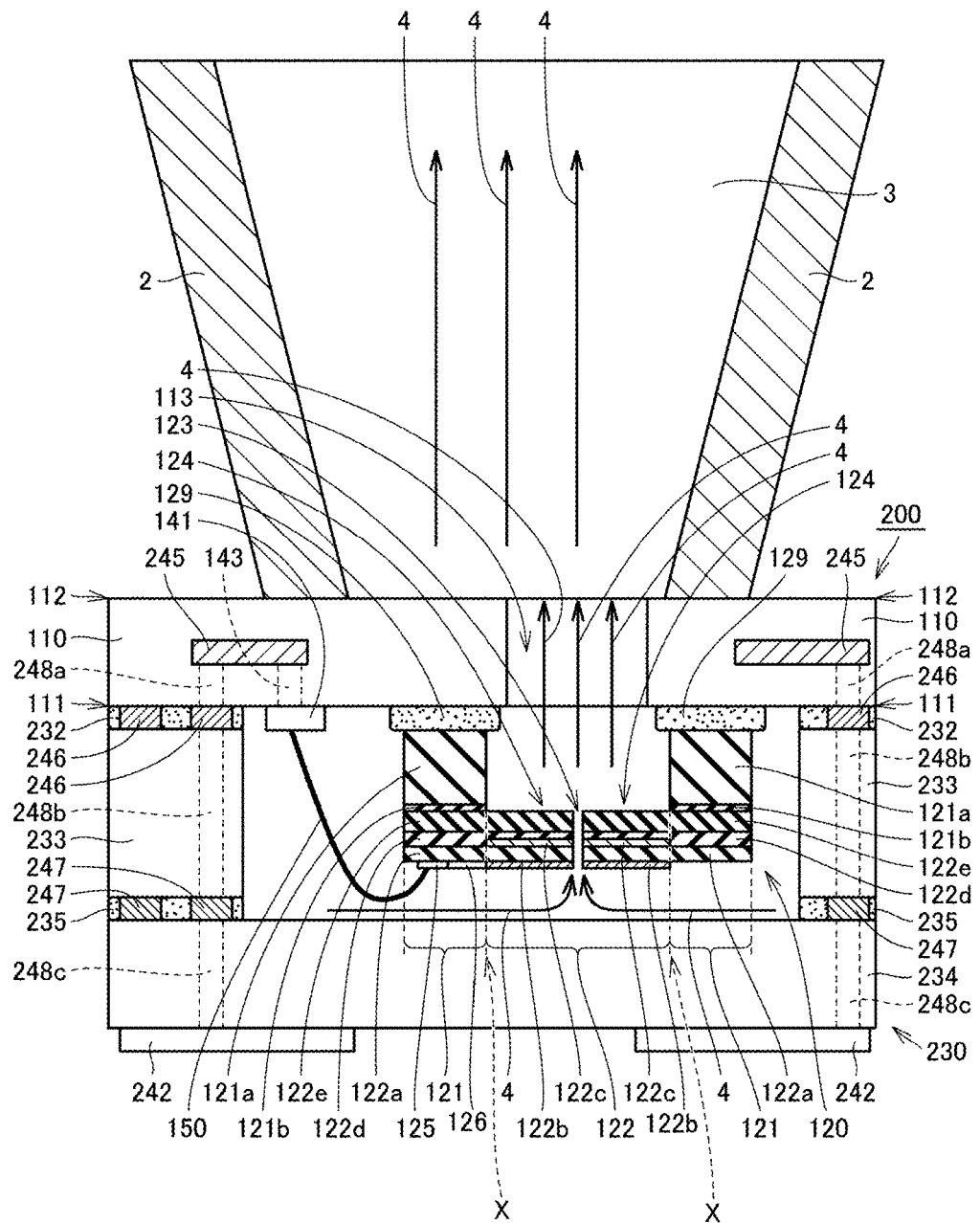
FIG. 17 is a sectional view illustrating a state in which a suction collet holds a piezoelectric device according to Preferred Embodiment 2 of the present invention.

Next, a non-limiting example of a method of mounting the piezoelectric device 200 according to the present preferred embodiment on a mounting substrate will be described. When the piezoelectric device 200 according to the present preferred embodiment is mounted on the mounting substrate, a surface mount machine including a suction collet is used. FIG. 17 is a sectional view illustrating a state in which a suction collet holds the piezoelectric device according to Preferred Embodiment 2 of the present invention.

As illustrated in FIG. 17, by setting a suction hole 3 inside a suction collet 2 to be under negative pressure, the piezoelectric device 200 is held in a state of being suctioned by the suction collet 2. In the present preferred embodiment, in order to bond the second electrode 242 to an electrode of the mounting substrate, the suction collet 2 suctions the second main surface 112 of the substrate 110.

In the present preferred embodiment, since the second main surface 112 of the substrate 110 is suctioned by the suction collet 2, a first through hole 113 and the suction hole 3 may be located to overlap each other in the normal direction. With this, the pressure in a space surrounded by the substrate 110 and the piezoelectric element 120 becomes negative with respect to the pressure of the external space of the piezoelectric device 200.

In the present preferred embodiment, since a through slit 123 is provided in a membrane portion 122, air 4 located in a space on the lid 230 side relative to the membrane portion 122 is also sucked out, such that the pressure of the space on the lid 230 side relative to the membrane portion 122 also becomes negative with respect to the pressure of the external space of the piezoelectric device 200. That is, a difference in pressure between the space surrounded by the substrate 110 and the piezoelectric element 120 and the space on the lid 230 side relative to the membrane portion 122 is reduced by the through slit 123. This makes it possible to reduce or prevent a situation in which the membrane portion 122 is deformed and broken.

In the present preferred embodiment, since each of a plurality of beams 124 are supported at one end thereof, when a pressure difference occurs between the above-mentioned two spaces, the other end of each of the plurality of beams 124 is deformed to warp in the normal direction. Since each of the plurality of beams 124 is deformed, the width of the through slit 123 is widened, thus making it possible to reduce or prevent a situation in which the above pressure difference becomes equal to or greater than a set value.

Next, piezoelectric devices according to first and second modifications of Preferred Embodiment 2 of the present invention will be described. Piezoelectric devices according to the first and second modifications of Preferred Embodiment 2 of the present invention differ from the piezoelectric device according to Preferred Embodiment 2 of the present invention in that a through hole different from a first through hole is provided in a substrate.

Figure 18:
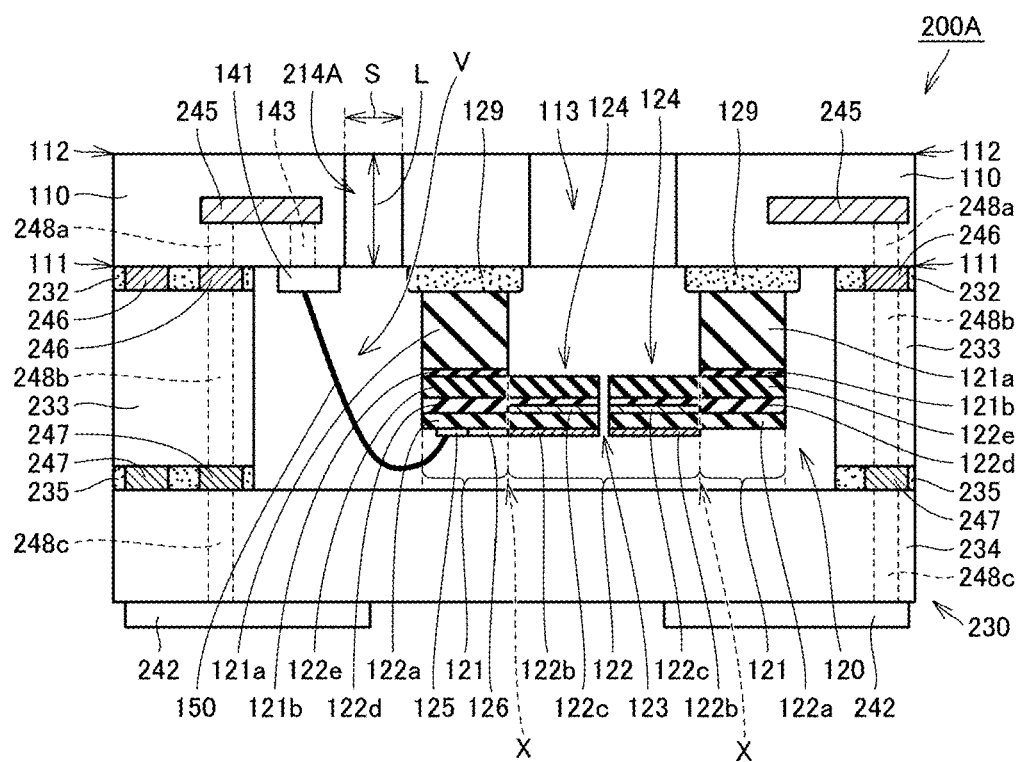
FIG. 18 is a sectional view illustrating a piezoelectric device according to a first modification of Preferred Embodiment 2 of the present invention.
Figure 19:
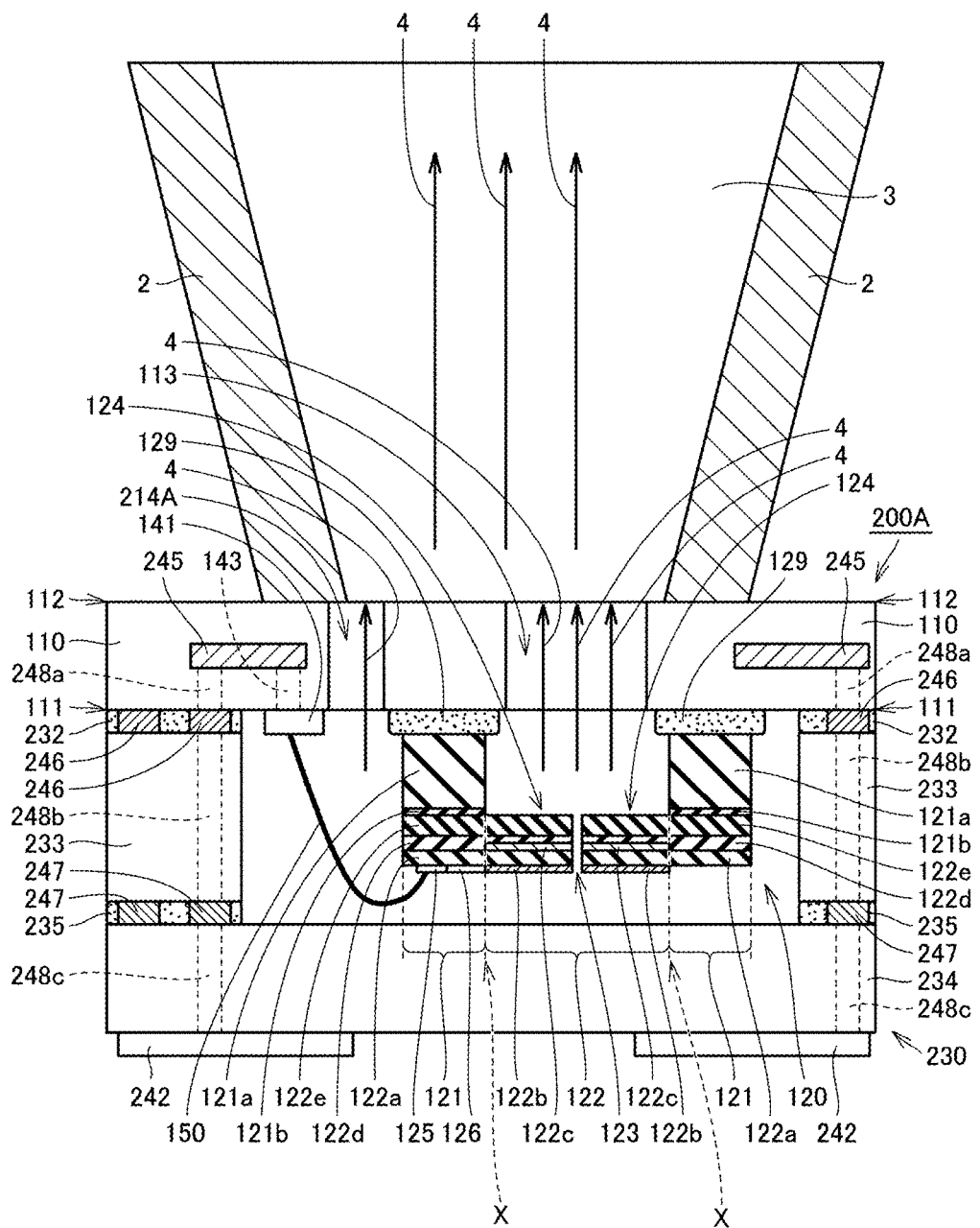
FIG. 19 is a sectional view illustrating a state in which a suction collet holds a piezoelectric device according to the first modification of Preferred Embodiment 2 of the present invention.

FIG. 18 is a sectional view illustrating the configuration of a piezoelectric device according to the first modification of Preferred Embodiment 2 of the present invention. FIG. 19 is a view illustrating a state in which a suction collet holds a piezoelectric device according to the first modification of Preferred Embodiment 2 of the present invention.

As illustrated in FIGS. 18 and 19, in a piezoelectric device 200A according to the first modification of Preferred Embodiment 2 of the present invention, a second through hole 214A extending from a first main surface 111 to a second main surface 112 is provided in a substrate 110 at a position of an outer side portion of a piezoelectric element 120 and an inner side portion of a bonding portion 232 with a lid 230 when viewed from the normal direction.

In the present modification, since a first through hole 113 and the second through hole 214A are provided, the air may also pass through the second through hole 214A when the device is held by a suction collet 2. This makes it possible to further reduce a pressure difference between a space surrounded by the lid 230, the piezoelectric element 120 and the substrate 110, and a space surrounded only by the substrate 110 and the piezoelectric element 120. Consequently, deformation of a membrane portion 122 may be further reduced or prevented.

In the present preferred embodiment, the second through hole 214A may also be used as a hole to allow ultrasonic waves to pass therethrough. At this time, the piezoelectric device 200A may be configured such that Helmholtz resonance of ultrasonic waves transmitted and received through the second through hole 214A is caused in a space on the lid 230 side relative to the piezoelectric element 120. To be specific, a length L of the second through hole 214A, an aperture area S of the second through hole 214A, and a volume V of a space surrounded by the substrate 110, the piezoelectric element 120, and the lid 230 are adjusted so that the value of a resonance frequency f expressed by Equation (2) below approaches a frequency of the ultrasonic waves transmitted and received by the piezoelectric elements 120. In the following Equation (2), c represents an acoustic velocity, and ΔL represents the length of an aperture end correction of the second through hole 214A.

$$f = \frac{c}{2\pi}\sqrt{\frac{S}{V(L+\Delta L)}} \quad (2)$$

Figure 20:
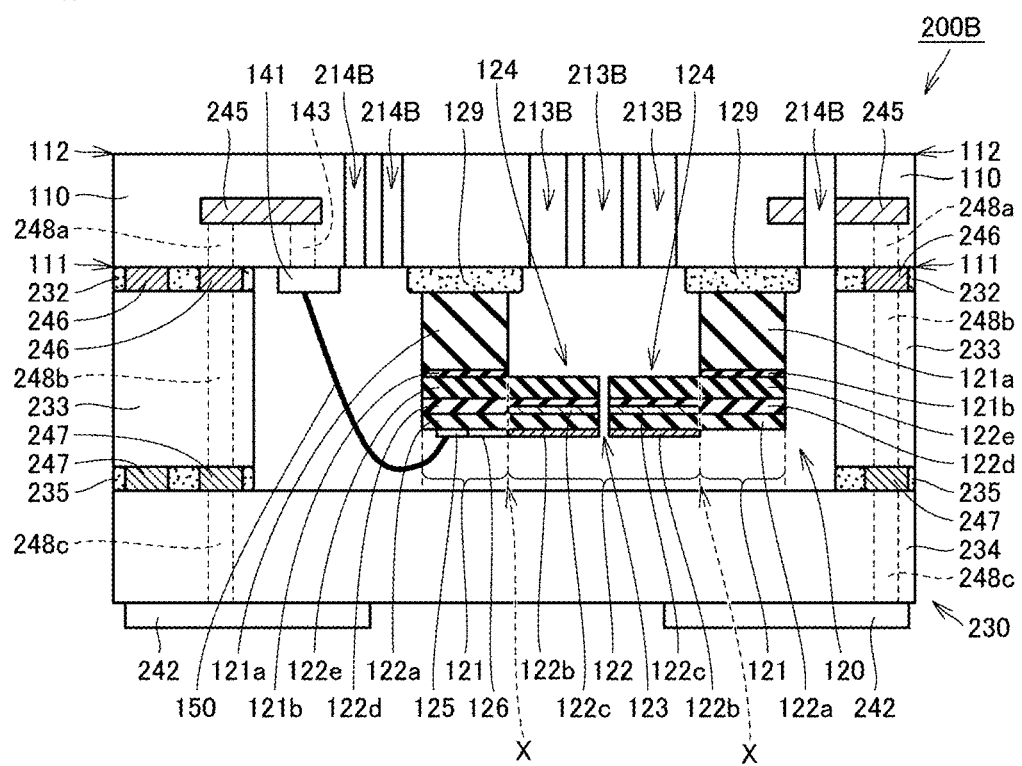
FIG. 20 is a sectional view illustrating a piezoelectric device according to a second modification of Preferred Embodiment 2 of the present invention.

FIG. 20 is a sectional view illustrating the configuration of a piezoelectric device according to the second modification of Preferred Embodiment 2 of the present invention.

As illustrated in FIG. 20, in a piezoelectric device 200B according to the second modification of Preferred Embodiment 2 of the present invention, a plurality of first through holes 213B are provided, and a plurality of second through holes 214B are provided in a substrate 110.

This makes it possible to reduce or prevent a situation in which the pressure locally rises in each of a space surrounded by a lid 230, a piezoelectric element 120 and the substrate 110, and a space surrounded only by the substrate 110 and the piezoelectric element 120 when device is held by the suction collet 2. In addition, since the hole size of each of the plurality of first through holes 213B and the plurality of second through holes 214B may be reduced, it is possible to reduce or prevent a situation in which foreign matter enters into each of the above two spaces.

In the description of the preferred embodiments described above, the configurations allowed to be combined may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a substrate including a first main surface and a second main surface opposite to the first main surface;
   a piezoelectric element on the first main surface; and
   a lid on the first main surface, covering the piezoelectric element, and being spaced apart from the piezoelectric element on the first main surface side; wherein
   the piezoelectric element is on the first main surface, and includes a base portion with an annular outer shape in a view from a normal direction of the first main surface and a membrane portion at an inner side portion of the base portion in the view from the normal direction;
   a first through hole extending from the first main surface to the second main surface is provided at a position facing the membrane portion in the substrate;
   an annular electrode surrounds the first through hole on the second main surface in the view from the normal direction; and
   the membrane portion includes a through slit.

2. The piezoelectric device according to claim 1, wherein the membrane portion includes a plurality of beams defined by the through slit; and
   one end of each of the plurality of beams is supported by the base portion.

3. The piezoelectric device according to claim 1, wherein the lid and the substrate are bonded to each other by a bonding portion having liquid-tightness.

4. The piezoelectric device according to claim 1, wherein a boundary between the membrane portion and the base portion is located at an outer side portion relative to the first through hole in the view from the normal direction.

5. The piezoelectric device according to claim 1, wherein
   a boundary between the membrane portion and the base portion is located at an inner side portion relative to an outer shape of the first through hole in the view from the normal direction; and
   an outer circumferential edge of the piezoelectric element is located at an outer side portion relative to the first through hole in the view from the normal direction.

6. The piezoelectric device according to claim 1, wherein a plurality of first through holes are provided; and
the plurality of first through holes are arranged in a matrix shape at equal or substantially equal intervals in a region of the substrate corresponding to the membrane portion in the view from the normal direction.

7. The piezoelectric device according to claim 1, wherein a second through hole extending from the first main surface to the second main surface is provided in the substrate at a position of an outer side portion of the piezoelectric element and an inner side portion of a bonding portion with the lid in the view from the normal direction.

8. The piezoelectric device according to claim 7, wherein, in the substrate, a plurality of first through holes and a plurality of second through holes are provided.

9. An ultrasonic transducer comprising:
a mounting substrate; and
a piezoelectric device mounted on the mounting substrate; wherein
the piezoelectric device includes:
a substrate including a first main surface and a second main surface opposite to the first main surface;
a piezoelectric element on the first main surface; and
a lid on the first main surface, covering the piezoelectric element, and being spaced apart from the piezoelectric element on the first main surface side;
the piezoelectric element is on the first main surface, and includes a base portion with an annular outer shape in a view from a normal direction of the first main surface and a membrane portion at an inner side portion of the base portion in the view from the normal direction;
a first through hole extending from the first main surface to the second main surface is provided at a position facing the membrane portion in the substrate;
the membrane portion includes a through slit;
the mounting substrate faces the second main surface and includes a third through hole; and
an end portion on the piezoelectric device side of the third through hole faces the first through hole.

10. The ultrasonic transducer according to claim 9, further comprising:
a housing to house the mounting substrate and the piezoelectric device; wherein
a fourth through hole facing the third through hole is provided in the housing.

11. The ultrasonic transducer according to claim 10, wherein a distance from the membrane portion, extending through the first through hole, the third through hole, and the fourth through hole, to an end portion of the fourth through hole on an opposite side to the piezoelectric device side is in a range from about 1.28 mm to about 4.17 mm.

12. The ultrasonic transducer according to claim 9, wherein
the membrane portion includes a plurality of beams defined by the through slit; and
one end of each of the plurality of beams is supported by the base portion.

13. The ultrasonic transducer according to claim 9, wherein the lid and the substrate are bonded to each other by a bonding portion having liquid-tightness.

14. The ultrasonic transducer according to claim 9, wherein a boundary between the membrane portion and the base portion is located at an outer side portion relative to the first through hole in the view from the normal direction.

15. The ultrasonic transducer according to claim 9, wherein
a boundary between the membrane portion and the base portion is located at an inner side portion relative to an outer shape of the first through hole in the view from the normal direction; and
an outer circumferential edge of the piezoelectric element is located at an outer side portion relative to the first through hole in the view from the normal direction.

16. The ultrasonic transducer according to claim 9, wherein
a plurality of first through holes are provided; and
the plurality of first through holes are arranged in a matrix shape at equal or substantially equal intervals in a region of the substrate corresponding to the membrane portion in the view from the normal direction.

17. The ultrasonic transducer according to claim 9, further comprising an annular electrode surrounding the first through hole on the second main surface in the view from the normal direction.

18. The ultrasonic transducer according to claim 9, wherein a second through hole extending from the first main surface to the second main surface is provided in the substrate at a position of an outer side portion of the piezoelectric element and an inner side portion of a bonding portion with the lid in the view from the normal direction.

19. The ultrasonic transducer according to claim 18, wherein, in the substrate, a plurality of first through holes and a plurality of second through holes are provided.

* * * * *